(12) United States Patent
Park

(10) Patent No.: US 6,215,153 B1
(45) Date of Patent: Apr. 10, 2001

(54) MOSFET AND METHOD FOR FABRICATING THE SAME

(75) Inventor: Sung Kye Park, Chungcheongbuk-do (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/235,747

(22) Filed: Jan. 25, 1999

(30) Foreign Application Priority Data

Jan. 26, 1998 (KR) .................................................... 98-2328

(51) Int. Cl.⁷ .................................................. H01L 31/119
(52) U.S. Cl. .......................... 257/344; 257/408; 438/162; 438/163
(58) Field of Search .................................... 257/336, 344, 257/345, 408; 438/162, 163, 218, 405, 407

(56) References Cited

U.S. PATENT DOCUMENTS

| | | | |
|---|---|---|---|
| 4,700,454 | 10/1987 | Baerg et al. | 437/24 |
| 4,810,664 | 3/1989 | Kamins et al. | 437/26 |
| 4,837,186 | * 6/1989 | Ohata et al. | 437/228 |
| 4,908,681 | * 3/1990 | Nishida et al. | 357/23.3 |
| 5,049,992 | 9/1991 | Citta et al. | 358/140 |
| 5,262,854 | 11/1993 | Ng | 358/133 |
| 5,565,925 | 10/1996 | Kinouchi et al. | 348/424 |
| 5,593,928 | 1/1997 | Lee | 437/41 |
| 5,614,952 | 3/1997 | Boyce et al. | 348/392 |
| 5,641,980 | * 6/1997 | Yamaguchi et al. | 257/347 |
| 5,712,173 | * 1/1998 | Liu et al. | 437/24 |
| 5,977,602 | * 11/1999 | Gardner et al. | 257/438 |

* cited by examiner

Primary Examiner—Sara Crane
(74) Attorney, Agent, or Firm—Fleshner & Kim, LLP

(57) ABSTRACT

Barrier layers of an insulating material block the diffusion of the halo ions to an edge portion of the gate electrode, the halo ions being injected for improving short channel characteristic. The barrier layers prevent an increase of a threshold voltage of the device and improve electrical characteristics of the device.

19 Claims, 5 Drawing Sheets

MOSFET AND METHOD FOR FABRICATING THE SAME

BACKGROUND OF THE, INVENTION

1. Field of the Invention

The present invention relates to a semiconductor device, and more particularly, to a metal oxide silicon field effect transistor (MOSFET) and a method for fabricating the same.

2. Background of the Related Art

The reduction of the size of semiconductor devices results in high integration, especially the size of the transistors. Such a reduction reduces the channel lengths, which causes punch-through and increases leakage current between a source and a drain due to a shortened distance between the source and drain.

FIGS. 1A–1D illustrate processes for fabricating a MOSFET. Referring to FIG. 1A, after implanting channel ions into a surface of a first conductive type semiconductor substrate 11, an insulating film is formed on an entire surface of the semiconductor substrate 11 and then patterned to form a gate insulating film 12 on a channel region 17 of the semiconductor substrate 11. A polysilicon layer 13 for a gate electrode is formed on the gate insulating film 12. As shown in FIG. 1B, a photoresist (not shown) is coated on the polysilicon layer 13. The photoresist is subjected to an exposure process and a development process for patterning the photoresist to define a gate electrode region. The polysilicon layer 13 is selectively dry-etched using the patterned photoresist as a mask for dry-etching, thereby forming a gate electrode 13a.

Impurity ions are implanted into the semiconductor substrate 11 using the gate electrode 13a as a mask for ion-implantation, thereby forming LDD (Lightly Doped Drain) regions 14 in the surface of the semiconductor substrate 11 at both sides of the gate electrode 13a. Ions having the first conductivity, same as the channel are implanted vertically or tiltly, to form first conductive impurity regions 14a. The impurity regions 14a improve short channel characteristic.

As shown in FIG. 1C, an insulating film is formed on the entire surface of the substrate 11 including the gate electrode 13a and then etched-back to form insulating sidewalls 15 at both sides of the gate electrode 13a. When impurities ions are heavily implanted into the semiconductor substrate 11 using the insulating sidewalls 15 and the gate electrode 13a as masks for ion-implantation, impurity regions 16 are formed as a sources and a drain D, as shown in FIG. 1D.

However, the process for fabricating a MOSFET according to the background art has the following problem. When the impurity ions are implanted to form the halo regions for improving short channel characteristic, the impurity ions are implanted heavier at the edge portions than a center portion of the channel, thereby resulting in an increase of a threshold voltage and also changing the characteristic of a threshold voltage according to a length of the channel at the end.

SUMMARY OF THE INVENTION

An object of the present invention is to substantially obviate one or more of the problems due to limitations and disadvantages of the related art.

An object of the present invention is to provide an MOSFET and a method of fabricating the same which can prevent variation of a threshold voltage due to halo ions, thereby improving electrical characteristics of the MOSFET.

To achieve these and other advantages and in accordance with the purpose of the present invention, as embodied and broadly described, the MOSFET includes a first conductive type substrate, having a channel therein, a gate electrode formed on the channel region, a high concentration impurity regions of a second conductive type formed on the surface of the substrate and adjacent to both sides of the channel region, low concentration impurity regions of a second conductive type formed between the channel region and high concentration impurity regions, impurity regions of the first conductivity type formed beneath the low concentration impurity regions of the second conductive type and diffusion barriers formed between the low concentration impurity regions of the second conductive type and the impurity regions of the first conductive type.

Another aspect of the present invention includes a method for fabricating an MOSFET including the steps of forming two diffusion barrier layers spaced from each other on an substrate of the first conductive type, growing an epitaxial layer on the entire surface of the substrate with a thickness enough to cover the barrier layers, forming a gate insulating film on a region of epitaxial layer and forming a gate electrode on the gate insulating film, implanting impurity-ions of a second conductive type having a low concentration into the epitaxial layer to form low concentration impurity regions of the second conductive type, implanting impurity-ions of the first conductive type into the substrate to form impurity regions of the first conductive type and implanting impurity-ions the second conductive type having a high concentration into the epitaxial layer including the substrate to form high concentration impurity regions in the surface of the epitaxial layer and at both sides of the gate electrode.

The present invention can be achieved in a whole or in parts by a semiconductor device, comprising: a substrate; a control electrode insulatively formed over the substrate; first and second impurity regions of a first conductivity type formed in the substrate and substantially adjacent to first and second sides, respectively, of the control electrode, each of the first and second impurity regions having first and second concentration regions; a third impurity region of a second conductivity type formed beneath the first concentration region of the first and second impurity regions; and an insulation layer formed between the third impurity region and the first concentration region of the first and second impurity regions.

The present invention can be also achieved in a whole or in parts by a method of making a semiconductor device, the method comprising the steps of: forming two insulation layers spaced from each other on a semiconductor substrate; forming a semiconductor layer on the entire surface of the semiconductor substrate with a thickness enough to cover the two insulation layers; forming a gate insulating film on a region of the semiconductor layer and forming a gate electrode on the gate insulating film; forming first impurity regions in the semiconductor layer and substantially next to opposing sides of the gate electrode, each first impurity region including an impurity portion formed over a corresponding one of the two insulation layers; forming second impurity regions beneath the two insulation layers.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF THE PREFERRED EMBODIMENT

Figure 1A:
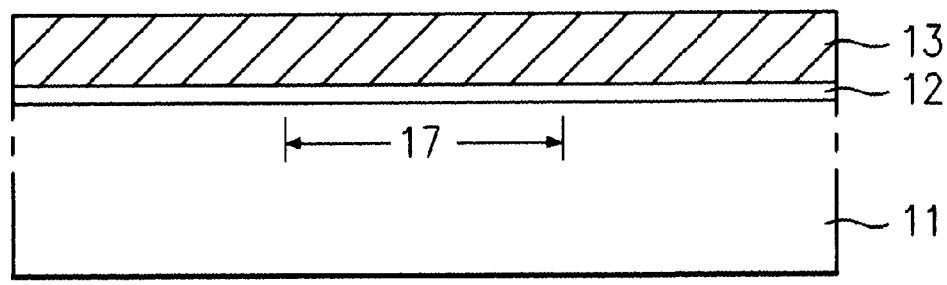
FIGS. 1A to 1D illustrates a process for fabricating a MOSFET according to a background art.
Figure 1B:
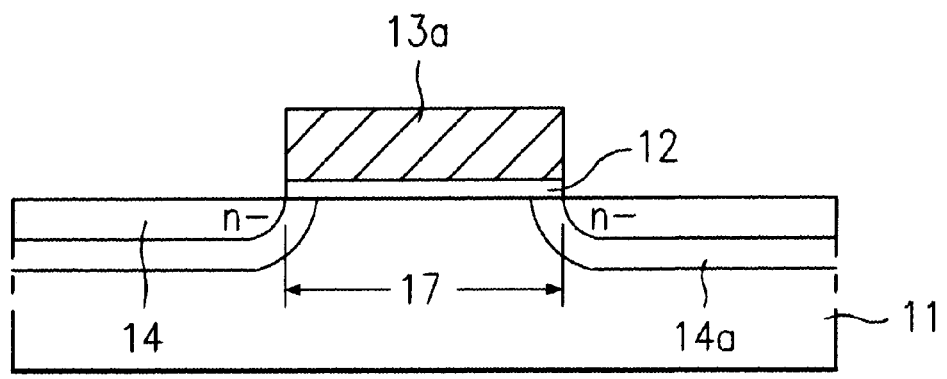
Figure 1C:
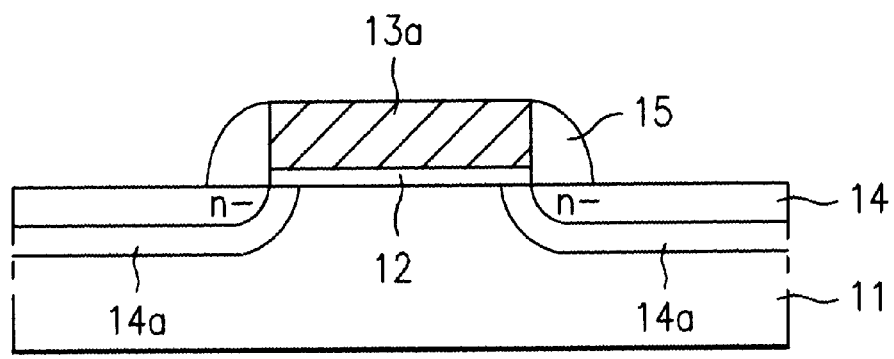
Figure 1D:
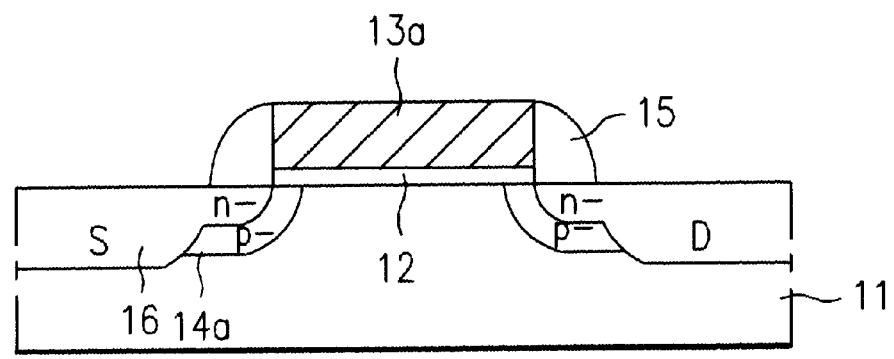
Figure 2:
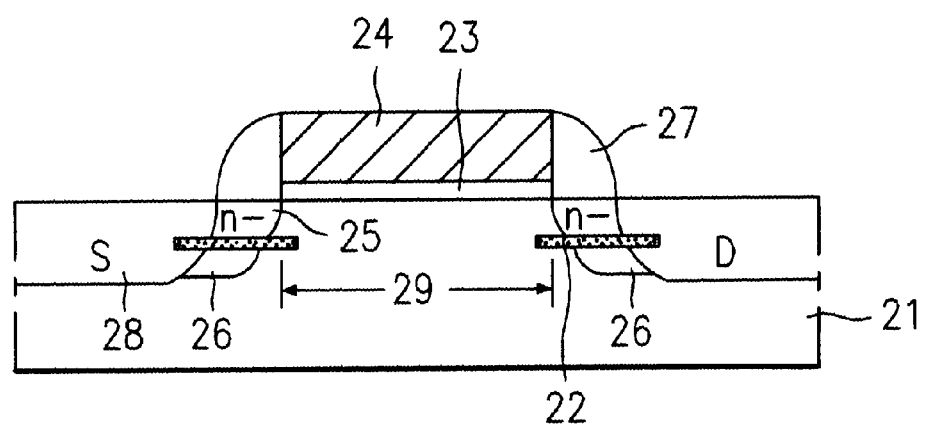
FIG. 2 illustrates a sectional view of an MOSFET according to the present invention.

Referring to FIG. 2, the MOSFET in accordance with a preferred embodiment of the present invention includes a semiconductor substrate 21 of P-conductive type having a channel region 29 in the surface of the substrate 21, a gate insulating film 23 formed on the channel region 29, a gate electrode 24 formed on the gate insulating film 23, sidewall spacers 27 formed at both sides of the gate electrode 24 and the gate insulating film 23.

High concentration impurity regions 28 of a N-conductive type are formed in the surface of the substrate 21 and adjacent to both sides of the channel region 29, and low concentration impurity regions 25 of N-conductive type are formed in the surface of the substrate 21 between the channel region 29 and the high concentration impurity regions 28 of N-conductive type. Impurity regions 26 of the P-conductive type are formed beneath the low concentration impurity regions 25 of the N-conductive type, and diffusion barriers 22 are formed between the low concentration impurity regions of the N-conductive type and the impurity regions of the P-conductive type. The substrate may be just a semiconductor substrate or an epitaxial layer formed on the semiconductor substrate.

Figure 3A:
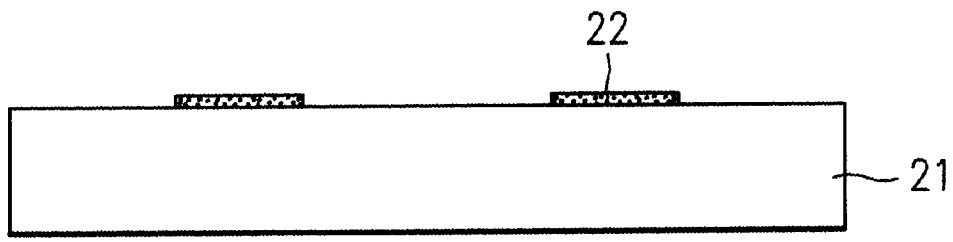
FIGS. 3A to 3D illustrates a process for fabricating a MOSFET according to the present invention.
Figure 3B:
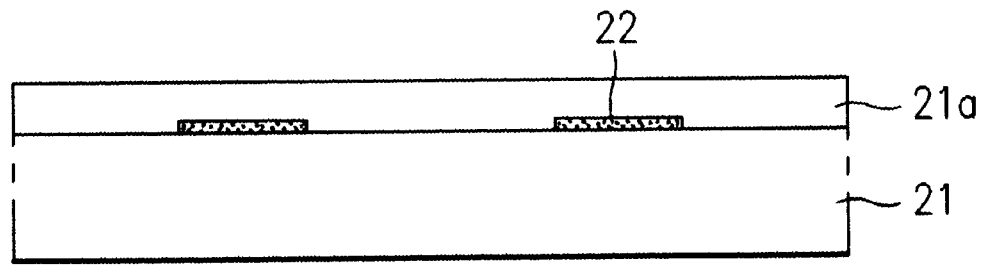

FIGS. 3A–3D illustrates a process steps of fabricating a MOSFET in accordance with a preferred embodiment of the present invention. Referring to FIG. 3A, an insulating film is formed on a P-conductive type semiconductor substrate 21 and selectively removed, to form two barrier layers 22 spaced from each other by a prescribed distance on the substrate 21. The barrier layers 22 are made of an insulating material such as silicon oxide and silicon nitride. As shown in FIG. 3B, an epitaxial layer 21a is grown using the substrate 21 as a seed layer and has sufficient thickness to cover the barrier layers 22.

Figure 3C:
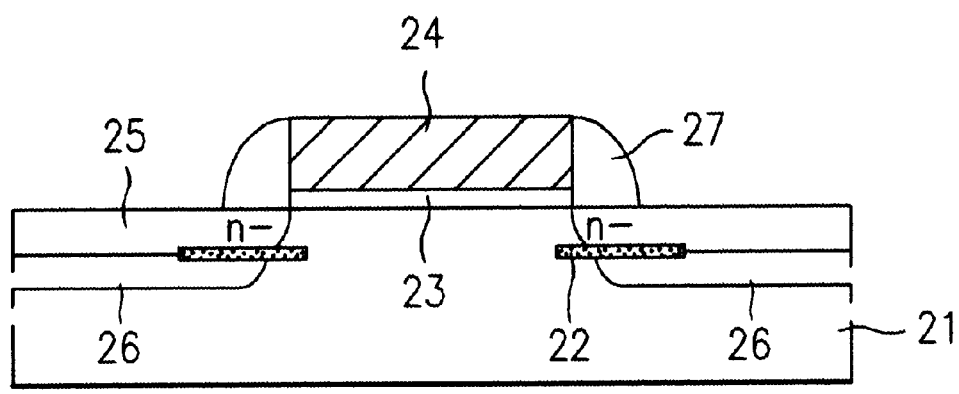

As shown in FIG. 3C, a gate insulating film 23 and a gate electrode 24 are formed on a region of the epitaxial layer 24a. The region is corresponding to a channel region 29. In other words, after growing the gate insulating film 23 on the epitaxial layer 21a, a polysilicon layer (not shown) is formed thereon and photoresist (not shown) is coated on the polysilicon layer. The photoresist is patterned by subjecting the photoresist to exposure and development process. As a result, a photoresist pattern is used as a mask for selectively etching the polysilicon layer and the gate insulating film until a surface of the epitaxial layer 21a is exposed.

After forming the gate electrode 24 and the gate insulating film 23, impurity ions of N-conductive type are implanted into the surface of the epitaxial layer 21a using the gate electrode 24 as a mask for ion-implantation, thereby forming lightly doped drain (LDD) regions 25 in the surface of the epitaxial layer 21a at both sides of the gate electrode 24. Then, halo ions of P-conductive type are implanted using the gate electrode 24 as a mask for ion-implantation, to form P-conductive type impurity regions 26 in the surface of the semiconductor substrate 21 beneath the barrier layers 22. These barrier layers 22 serve as diffusion barriers which prevent the halo ions from being diffused to the edge portions of the gate electrode 24 during a following annealing process for diffusion of ions. The halo ions has P-conductive type, which is a conductivity opposite to N-conductive type of the source and drain regions to be formed later, and are implanted tiltly or vertically.

After forming the P-conductive type impurity regions 26, an insulating film is formed on the whole exposed surface of the epitaxial layer 21a including the gate electrode 24 and the gate insulating layer 23. The insulating film is then etched back to form insulating sidewalls 27 at both sides of the gate electrode 24. In order to etch-back the insulating film, a dry etching such as Reactive Ion Etching (RIE) is used.

Figure 3D:
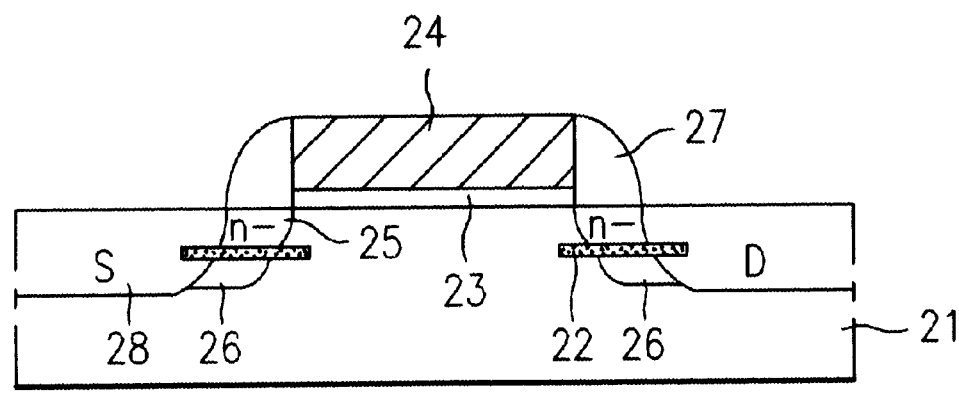

As shown in FIG. 3D, N-conductive type impurity ions are heavily implanted into the P-type substrate 21 using the gate electrode 24 and the insulating sidewalls 27 as masks during ion-implantation. The substrate 21 is then subjected to an annealing process to form N-conductive type source and drain regions 28 in the semiconductor substrate 21 and the epitaxial layer 21a at both sides of the gate electrode 24. Hence, the source and drain regions 28 have a higher concentration than the LDD regions 25.

As discussed earlier, the barrier layers 22 block the halo ions, having P-conductive type, from being diffused to the edge portions of the gate electrode 24. Because the epitaxial layer 21a is grown using the substrate 21, the epitaxial layer 21a may be regarded as a part of the substrate 21 and also it has a same conductive type as the substrate 21.

The MOSFET and the method for fabricating a MOSFET of the present invention have various advantages. As diffusion of the halo ions to an edge portion of the gate electrode is prevented in the halo ion diffusion, the halo ions being injected for improving short channel characteristic by forming barrier layers in the semiconductor substrate below edge portion of the gate electrode, an increase of a threshold voltage of the device can be prevented. This prevention of threshold voltage variation improves electrical characteristics of the device.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed ts:

1. A semiconductor device, comprising:

a substrate;

a control electrode insulatively formed over said substrate;

first and second impurity regions of a first conductivity type formed in said substrate and substantially adjacent to first and second sides, respectively, of said control electrode, each of said first and second impurity regions having first and second concentration regions;

a third impurity region of a second conductivity type formed beneath the first concentration region of said first and second impurity regions; and first and second insulation layers respectively formed between said third impurity regions and the first concentration region of said first and second impurity regions, wherein a region in the substrate beneath said control electrode defines a channel region, and said first concentration regions are respectively formed between said channel region and the second concentration regions, wherein said second concentration regions have a prescribed thickness extending from a top surface of the substrate, and wherein the first and second insulation layers are at a prescribed depth from the top surface that is less than the prescribed thickness.

2. The semiconductor device of claim 1, wherein said first and second concentration regions have different concentration of impurities.

3. The semiconductor device of claim 2, wherein each of said first concentration regions has a lower concentration of impurities than a corresponding one of said second concentration regions.

4. The semiconductor device of claim 1, wherein the first concentration regions are on and above the insulation layers, wherein portions of the second concentration regions are above and below the insulation layers, and wherein the third impurity regions are adjacent and below the insulation layers.

5. The semiconductor device of claim 1, wherein said first conductivity type is an n-type and the second conductivity type is a p-type.

6. The semiconductor device of claim 1, wherein said insulation layers are one of a silicon nitride layer and a silicon oxide layer.

7. The semiconductor device of claim 1, wherein said third impurity region is doped with halo ions.

8. The semiconductor device of claim 1, wherein a width of said insulation layers is wider than a width of said first concentration regions.

9. The semiconductor device of claim 1, wherein a width of said insulation layers is wider than a width of said third impurity regions.

10. The semiconductor device of claim 1, wherein a width of said insulation layers is wider than a width of said first concentration regions and a width of said third impurity regions.

11. The semiconductor device of claim 1, wherein an outer end of said insulation layers terminates in the second concentration region above a corresponding interface between the third impurity region and the second concentration region.

12. The semiconductor device of claim 1, further comprising side wall spacer formed at each of said first and second sides of the control electrode and on the substrate.

13. The semiconductor device of claim 12, wherein said first concentration region of each of said first and second impurity regions is formed beneath said side wall spacer.

14. A method of making a semiconductor device, the method comprising:
  forming first and second insulation layers spaced from each other on a first conductivity type semiconductor substrate;
  forming a first conductivity type semiconductor layer on the entire surface of the semiconductor substrate with a thickness enough to cover the two insulation layers;
  forming a gate insulating film on a region of the semiconductor layer and forming a gate electrode on the gate insulating film;
  forming first impurity regions of a second conductivity type in said semiconductor layer and substantially next to opposing sides of the gate electrode, each first impurity region including an impurity portion formed over a corresponding one of the first and second insulation layers;
  forming second impurity regions of the first conductivity type beneath the first and second insulation layers; and
  forming third impurity regions of the second conductivity type in said semiconductor layer and said substrate adjacent each of the corresponding first and second impurity regions and the insulation layers.

15. The method of claim 14, further comprising forming sidewalls next to the opposing sides of the gate electrode, wherein the first impurity regions are on and above the insulation layers, the second impurity regions are adjacent and below the insulation layers, and portions of the third impurity regions are above and below the insulation layers.

16. The method of claim 14 wherein said first and third impurity regions have different concentrations of impurities. and wherein an inner end of the insulation layers terminates below an interface of a channel region and the first impurity regions and wherein an outer end of the insulation layer terminates above an interface between the second and third impurity regions.

17. A semiconductor device, comprising:
  a substrate;
  a control electrode insulatively formed over said substrate;
  first and second impurity regions of a first conductivity type formed in said substrate and substantially adjacent to first and second sides, respectively, of said control electrode, each of said first and second impurity regions having first and second concentration regions;
  third impurity regions of a second conductivity type each formed beneath the first concentration region of said first and second impurity regions; and
  first and second insulation layers respectively formed between said third impurity regions and the first concentration region of said first and second impurity regions, wherein a region in the substrate beneath said control electrode defines a channel region, and said first concentration regions are respectively formed between said channel region and the second concentration regions, wherein an inner end of the insulation layer stops below an interface of the first concentration regions and the channel region, and wherein an outer end of the insulation layers stops above an interface between the third impurity regions and the second concentration regions.

18. The semiconductor device of claim 17, wherein said second concentration regions have a prescribed thickness extending from a top surface of the substrate, wherein the first and second insulation layers are above a prescribed depth from the top surface, and wherein the prescribed thickness is greater than the prescribed depth.

19. The semiconductor device of claim 17, wherein a width of each of the insulation layers is greater than a width of the first concentration regions and a width of the third impurity regions, and wherein portions of said second concentration regions are above and below the first and second insulation layers.

* * * * *